(12) United States Patent
Song et al.

(10) Patent No.: US 11,335,878 B2
(45) Date of Patent: May 17, 2022

(54) WINDOW MEMBER FOR DISPLAY DEVICE, DISPLAY DEVICE, AND MANUFACTURING METHOD FOR DISPLAY DEVICE

(71) Applicant: Samsung Display Co., LTD., Yongin-si (KR)

(72) Inventors: Kicheol Song, Suwon-si (KR); Youngmoon Kim, Asan-si (KR); Youngsang Park, Seoul (KR); Nari Ahn, Seongnam-si (KR); Hung Kun Ahn, Seongnam-si (KR); Jung-hun Jung, Asan-si (KR); Ojun Kwon, Hwaseong-si (KR); Junsu Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 113 days.

(21) Appl. No.: 16/835,301

(22) Filed: Mar. 31, 2020

(65) Prior Publication Data
US 2020/0395569 A1 Dec. 17, 2020

(30) Foreign Application Priority Data
Jun. 14, 2019 (KR) .................. 10-2019-0071056

(51) Int. Cl.
| | |
|---|---|
| *H01L 51/52* | (2006.01) |
| *H01L 27/32* | (2006.01) |
| *H01L 51/00* | (2006.01) |
| *H01L 51/56* | (2006.01) |

(52) U.S. Cl.
CPC .......... *H01L 51/524* (2013.01); *H01L 27/323* (2013.01); *H01L 27/3244* (2013.01); *H01L 51/0031* (2013.01); *H01L 51/0097* (2013.01); *H01L 51/5281* (2013.01); *H01L 51/56* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2015/0277110 A1* | 10/2015 | Oh ..................... | B32B 27/36 359/513 |
| 2016/0185926 A1 | 6/2016 | Song et al. | |
| 2017/0364029 A1 | 12/2017 | Cho et al. | |

(Continued)

FOREIGN PATENT DOCUMENTS

| | | |
|---|---|---|
| CN | 106373983 A | 2/2017 |
| CN | 108806515 A | 11/2018 |

(Continued)

OTHER PUBLICATIONS

Extended European Search Report for Application No. 20179612.5-1203 dated Nov. 13, 2020.

*Primary Examiner* — J. E. Schoenholtz
(74) *Attorney, Agent, or Firm* — Cantor Colburn LLP

(57) ABSTRACT

A display device includes a display module and a window member disposed on the display module, where the window member includes a base layer and a hard coating layer disposed on the base layer. A moisture absorption ratio of the window member is about 2.2% or greater under a first condition including a first temperature and a first humidity. The first temperature is about 60° C. or greater, and the first humidity is about 70% or greater.

19 Claims, 10 Drawing Sheets

(56) References Cited

U.S. PATENT DOCUMENTS

| | | | |
|---|---|---|---|
| 2018/0088392 | A1 | 3/2018 | Park et al. |
| 2018/0142127 | A1 | 5/2018 | Park et al. |
| 2018/0149785 | A1 | 5/2018 | Lee et al. |
| 2018/0231692 | A1 | 8/2018 | Ham et al. |
| 2018/0371196 | A1* | 12/2018 | Park ................. G06F 3/041 |
| 2020/0075872 | A1 | 3/2020 | Gu et al. |
| 2020/0243798 | A1 | 7/2020 | Matsushita et al. |
| 2021/0179795 | A1* | 6/2021 | Mori ............. C08G 73/1067 |

FOREIGN PATENT DOCUMENTS

| | | |
|---|---|---|
| KR | 1020160079549 A | 7/2016 |
| KR | 1020170141851 A | 12/2017 |
| KR | 1020180034056 A | 4/2018 |
| KR | 1020180039346 A | 4/2018 |
| KR | 1020180058912 A | 6/2018 |
| KR | 1020180094348 A | 8/2018 |
| KR | 1020200049942 A | 5/2020 |
| WO | 2019066080 A1 | 4/2019 |

* cited by examiner

WINDOW MEMBER FOR DISPLAY DEVICE, DISPLAY DEVICE, AND MANUFACTURING METHOD FOR DISPLAY DEVICE

This application claims priority to Korean Patent Application No. 10-2019-0071056, filed on Jun. 14, 2019, and all the benefits accruing therefrom under 35 U.S.C. § 119, the content of which in its entirety is herein incorporated by reference.

BACKGROUND

The disclosure herein relates to a window member of a foldable display device, a display device, and a manufacturing method for the display device.

A display device displays various images on a display screen and provides a user with the images. Generally, the display device displays information within a predetermined screen thereof. A flexible display device including a foldable flexible display panel has been developed. The flexible display device may be bent, rolled, or curved unlike a rigid display device. The flexible display device having a diversely changeable shape may be carried in a from irrespective of sizes of a screen thereof, and thus may improve user convenience.

SUMMARY

The disclosure provides a window member for a display device, having improved product reliability, and a display device including the window member.

The disclosure also provides a method for manufacturing a display device with improved product reliability.

An embodiment of the invention provides a display device including: a display module; and a window member disposed on the display module, where the window member includes a base layer and a hard coating layer disposed on the base layer, where a moisture absorption ratio of the window member is about 2.2% or less under a first condition including a first temperature and a first humidity, the first temperature is about 60° C. or greater, and the first humidity is about 70% or greater.

In an embodiment, the first temperature may be about 60° C., and the first humidity may be about 93%.

In an embodiment, the moisture absorption ratio may be a numerical value measured after maintained for about 2 hours under the first condition.

In an embodiment, the moisture absorption ratio may be a value in percentage corresponding to a ratio of a difference between a first weight and a second weight to the first weight of the window member, where the first weight represents a weight of the window member before subjected to the first condition, and the second weight represent a weight of the window member after maintained for about 2 hours under the first condition.

In an embodiment, the first weight may represent a weight of the window member after dried under a second condition different from the first condition.

In an embodiment, the second condition may include a second temperature and a second humidity, where the second temperature is about 60° C. is more, and the second humidity is about 0%.

In an embodiment, a Young's modulus of the window member measured under the first condition may be about 5 gigapascals (GPa) or greater.

In an embodiment, a test rate of a tensile test for measuring the Young's modulus may be about 5 millimeters per minute (mm/min).

In an embodiment, the Young's modulus may be measured in a section in which tensile strain of the window member is in a range of about 0.05% to about 0.5%.

In an embodiment, a yield point of the base layer under the first condition may be present in a section in which tensile strain of the base layer is about 1.09% or greater.

In an embodiment, a hardness of the window member may be about 0.3 GPa or greater.

In an embodiment, the hardness may be measured on a surface of the hard coating layer by a Berkovich indenter hardness test.

In an embodiment, each of the display module and the window member may include a folding area.

In an embodiment of the invention, a method for manufacturing a display device includes: preparing a window member including a base layer and a hard coating layer disposed on the base layer; preparing a first test sample having same physical properties as the window member; performing a first test of measuring a moisture absorption ratio of the first test sample under a first condition having first temperature and first humidity; preparing a second test sample having the same physical properties as the window member; performing a second test of measuring a Young's modulus of the second test sample under the first condition; preparing a third test sample having the same physical properties as the window member; performing a third test of measuring a hardness of the third test sample under a second condition different from the first condition; and coupling the window member to a display module when a predetermined condition is satisfied in at least one test selected from the first to third tests.

In an embodiment, the performing the first test may include: drying the first test sample; measuring first weight of the dried first test sample; maintaining the first test sample for about 2 hours under the first condition; measuring second weight of the first test sample; and determining whether or not a value in percentage corresponding to a ratio of a difference between the first weight and the second weight to the first weight is about 2.2% or less.

In an embodiment, the performing the second test may include: elongating the second test sample; measuring the Young's modulus of the second test sample; and determining whether or not the Young's modulus is about 5 GPa or greater, where a tensile rate of a tensile test to elongate the second test sample is about 5 mm/min, and the Young's modulus is measured in a section in which tensile strain is in a range of about 0.05% to about 0.5%.

In an embodiment, the performing the third test may include: disposing the third test sample on a stage; measuring the hardness of the third test sample using a Berkovich diamond indenter; and determining whether or not the hardness is about 0.3 GPa or greater.

In an embodiment of the invention, a window member for a display device includes: a base layer; and a hard coating layer disposed on the base layer, where a moisture absorption ratio of an entirety of the base layer and the hard coating layer is about 2.2% or less under a first condition including a first temperature and a first humidity, where the first temperature is about 60° C., and the first humidity is about 93%.

In an embodiment, the moisture absorption ratio may be a value in percentage corresponding to a ratio of a difference between a first weight and a second weight to the first weight of the entirety of the base layer and the hard coating layer, where the first weight represents a weight of the entirety of the base layer and the hard coating layer before subjected to the first condition, and the second weight represents a weight of the entirety of the base layer and the hard coating layer after maintained for about 2 hours under the first condition.

In an embodiment, a Young's modulus of the entirety of the base layer and the hard coating layer under the first condition may be about 5 GPa or greater, a yield point of the base layer under the first condition may be present in a section in which tensile strain of the base layer is about 1.09% or greater, and a hardness measured on a surface of the hard coating layer by a Berkovich indenter hardness test may be about 0.3 GPa or greater.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1A:
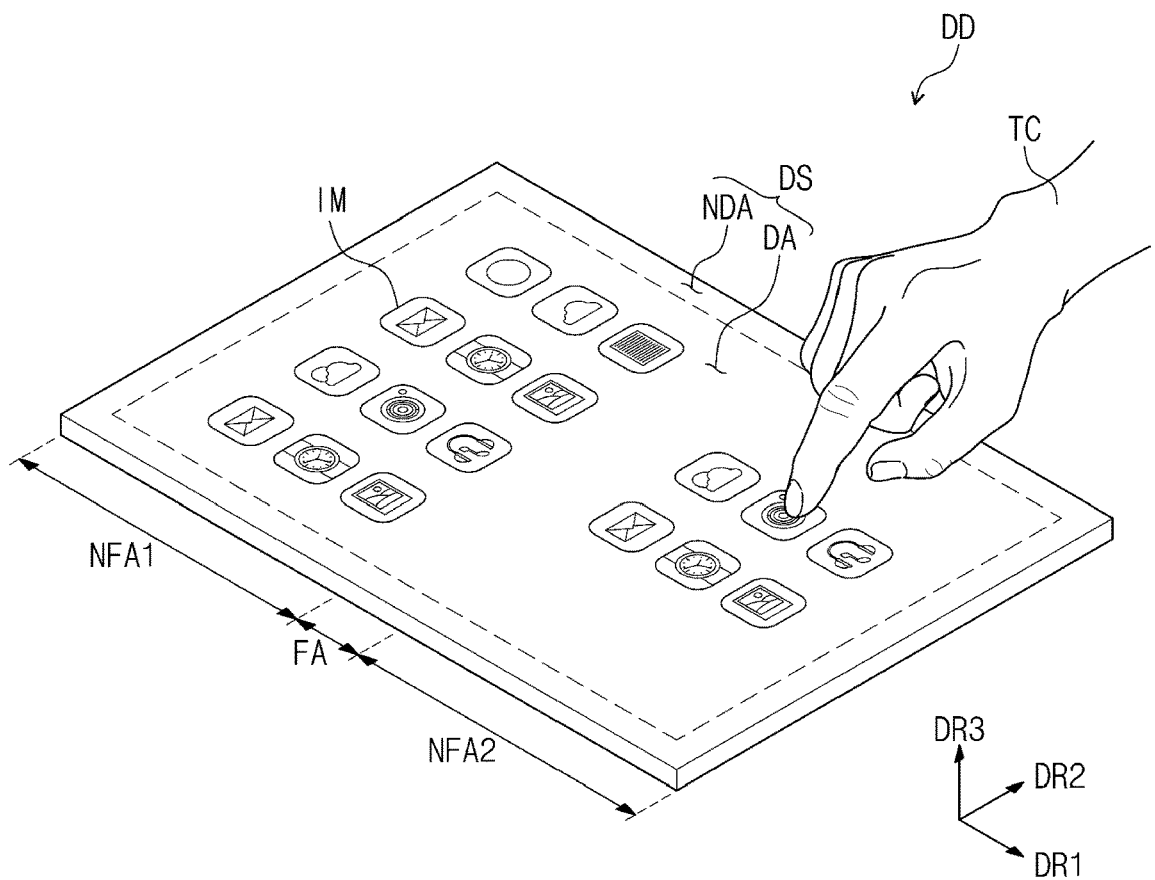
FIG. 1A is a perspective view of a display device according to an embodiment of the invention.

The invention now will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scopes of the invention to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the disclosure belongs. Also, terms as defined in a commonly used dictionary should be construed as having the same meaning as in an associated technical context, and unless ideally or excessively construed as having formal meaning, the terms may be defined apparently herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 1B:
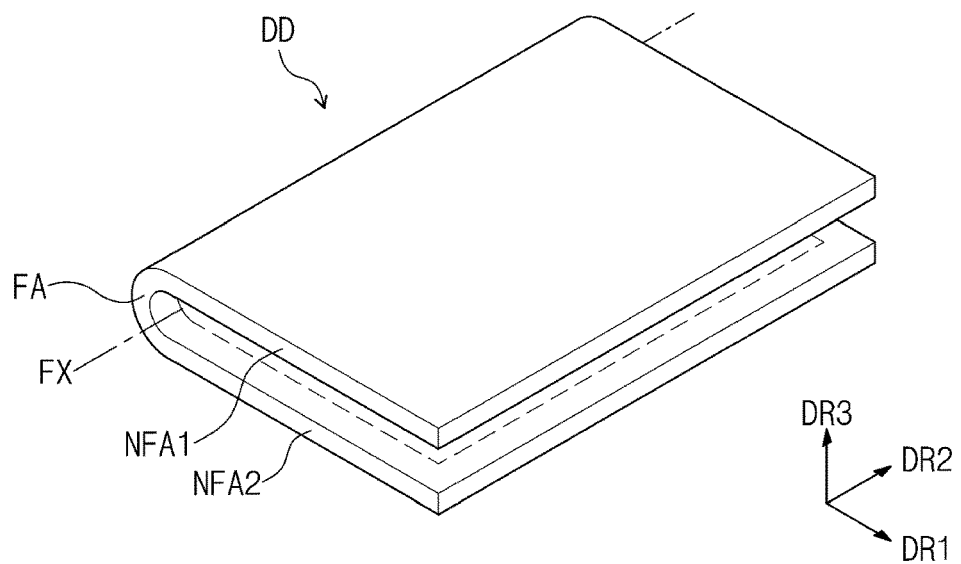
FIG. 1B is a view illustrating the display device illustrated in FIG. 1A in a folded state.

FIG. 1A is a perspective view of a display device according to an embodiment of the invention. FIG. 1B is a view illustrating the display device illustrated in FIG. 1A in a folded state.

Referring to FIG. 1A and FIG. 1B, an embodiment of a display device DD may be a foldable display device. Such an embodiment of the display device DD may be used in large scale electronic apparatuses such as televisions and monitors, as well as, in small-to-medium scale electronic apparatuses such as mobile phones, tablets, vehicular navigation devices, game consoles, and smart watches.

A top surface of the display device DD may be defined as a display surface DS, and the display surface DS in an unfolded state may be on a plane defined by a first direction DR1 and a second direction DR2. A third direction DR3 is a direction crossing both the first direction DR1 and the second direction DR2, and may be defined as a thickness direction of the display device DD.

The display surface DS may include a display area DA and a non-display area NDA adjacent to the display area DA. The display area DA is an area on which an image IM is displayed, and the non-display area NDA is an area on which the image IM is not displayed. In an embodiment, as shown in FIG. 1A, the image IM displayed on the display surface DS may be application icons, for example.

The display area DA may have a tetragonal shape. The non-display area NDA may surround the display area DA. However, embodiments of the invention are not limited thereto, and the shapes of the display area DA and the non-display area NDA may be variously modified.

In an embodiment of the display device DD, a first non-folding area NFA1, a folding area FA, and a second non-folding area NFA2 may be defined sequentially in the first direction DR1. In such an embodiment, the folding area FA may be defined between the first non-folding area NFA1 and the second non-folding area NFA2. In an embodiment, as shown in FIG. 1A and FIG. 1B, a single folding area FA and two folding areas, i.e., the first and second non-folding areas NFA1 and NFA2, are defined, but the number of the folding area FA and the first and second non-folding areas NFA1 and NFA2 are not limited thereto. Alternatively, the display device DD may include more than two, for example, a plurality of non-folding areas and folding areas disposed between the non-folding areas.

In an embodiment, as show in FIG. 1B, the display device DD may be folded with respect to a folding axis FX. In such an embodiment, the folding area FA may be bent with respect to the folding axis FX. The folding axis FX may extend in the second direction DR2. The folding axis FX may be defined as an axis parallel to a short side of the display device DD.

In such an embodiment, when the display device DD is folded, a display surface of the first non-folding area NFA1 and a display surface of the second non-folding area NFA2 may face each other. Thus, the display surface DS may not be exposed to the outside in a folded state. In an embodiment of the invention, a bottom display area (not shown) may be defined or provided on a bottom surface of the display device DD. In such an embodiment, when the display device DD is folded, the bottom display area may be exposed to the outside.

Figure 2A:
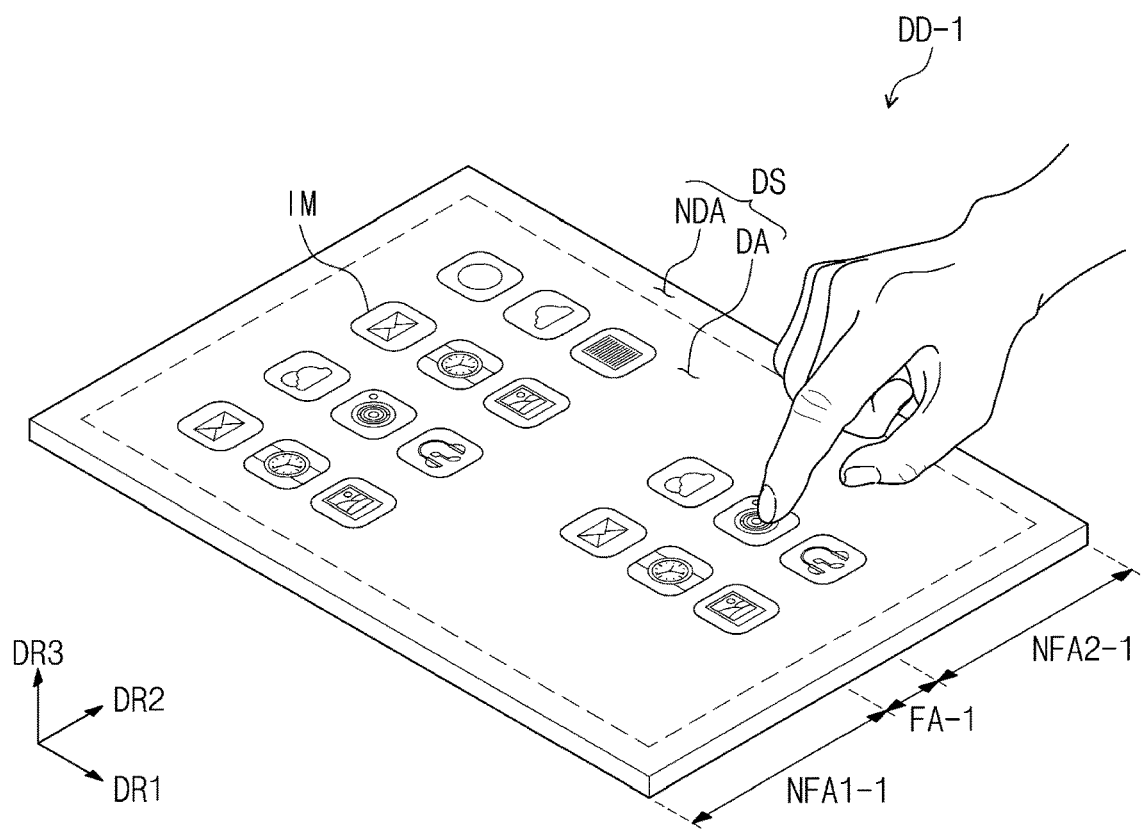
FIG. 2A is a perspective view of a display device according to an embodiment of the invention.
Figure 2B:
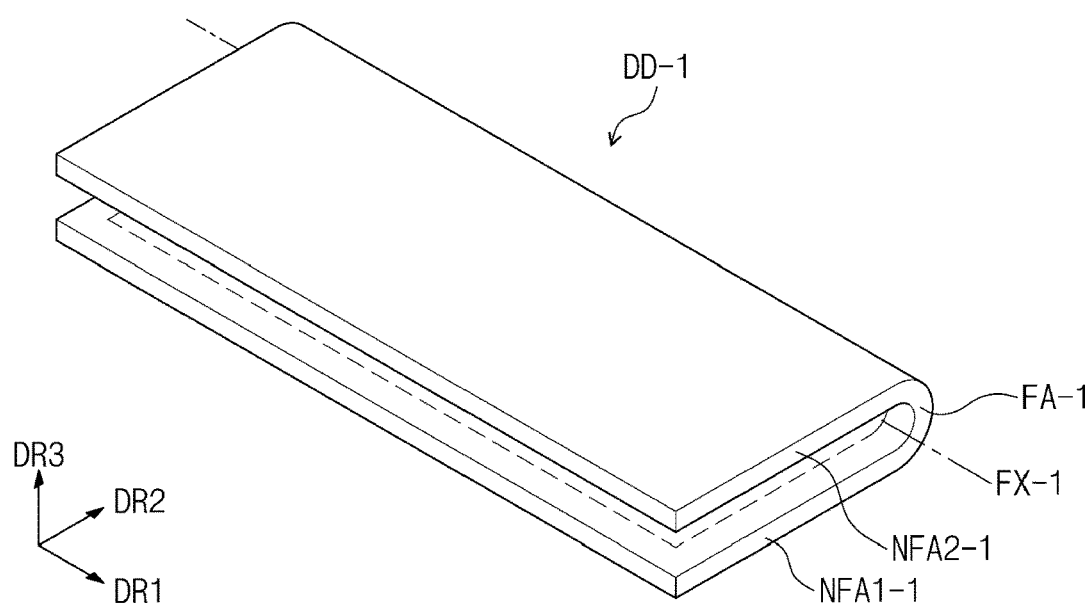
FIG. 2B is a view illustrating the display device illustrated in FIG. 2A in a folded state.

FIG. 2A is a perspective view of a display device according to an embodiment of the invention. FIG. 2B is a view illustrating a the display device illustrated in FIG. 2A in a folded state.

Referring to FIG. 2A and FIG. 2B, a first non-folding area NFA1-1, a folding area FA-1, and a second non-folding area NFA2-1 may be defined in a display device DD-1 sequentially in a second direction DR2. The folding area FA-1 may be defined between the first non-folding area NFA1-1 and the second non-folding area NFA2-1.

In an embodiment, as shown in FIG. 2B, the display device DD-1 may be folded with respect to a folding axis FX-1. That is, the folding area FA-1 may be bent with respect to the folding axis FX-1. The folding axis FX-1 may extend in a first direction DR1. The folding axis FX-1 may be defined as an axis parallel to a long side of the display device DD-1.

Hereinafter, for convenience of description, a structure of an embodiment of the display device DD foldable with respect to the axis FX (see FIG. 1A) parallel to the short side will be described in detail. However, embodiments of the invention are not limited thereto, and structures described hereinafter may also be applied to the display device DD-1 foldable with respect to the axis FX-1 parallel to the long side.

Figure 3A:
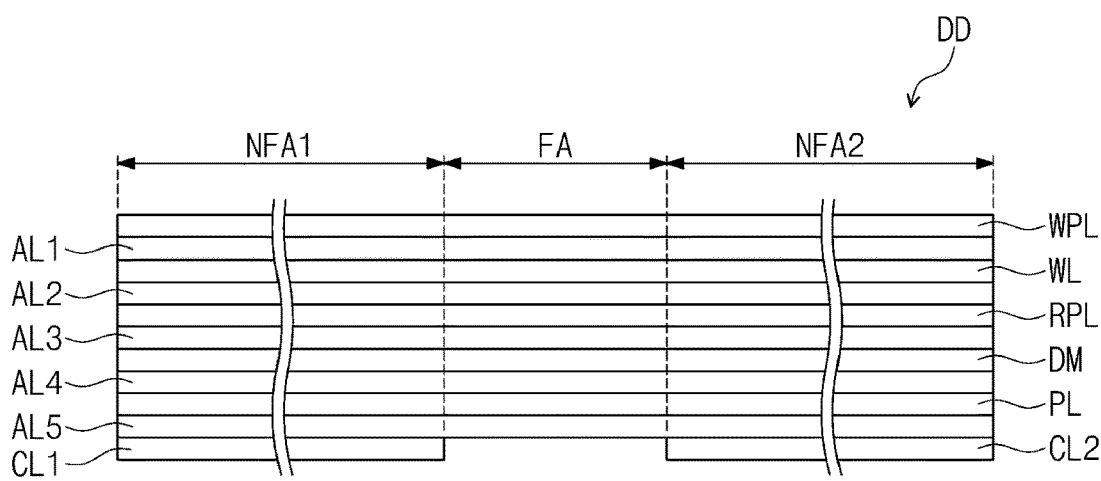
FIG. 3A is a cross-sectional view of a display device according to an embodiment of the invention.
Figure 3A:
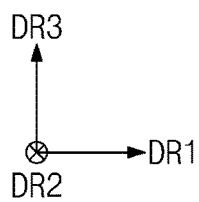
Figure 3B:
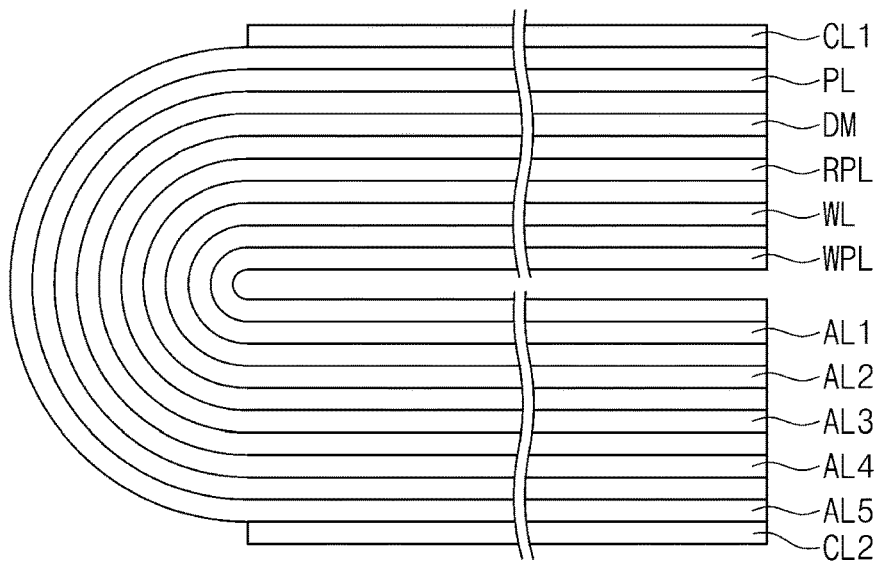
FIG. 3B is a cross-sectional view illustrating the display device illustrated in FIG. 3A in a folded state.
Figure 3B:
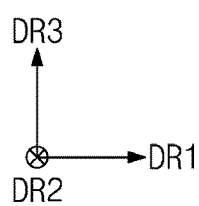

FIG. 3A is a cross-sectional view of a display device according to an embodiment of the invention. FIG. 3B is a cross-sectional view illustrating the display device illustrated in FIG. 3A in a folded state.

Referring to FIG. 3A and FIG. 3B, an embodiment of a display device DD may include a window protection layer WPL, a window member WL, a reflection prevention (or antireflective) layer RPL, a display module DM, a protection layer PL, first and second cover plates CL1 and CL2, and adhesive layers AL1, AL2, AL3, AL4, and AL5.

The display device DD may change from a first state having a flat shape to a second state having a folded shape, or change repeatedly from the second state to the first state or vice versa. The window protection layer WPL, the window member WL, the refection prevention layer RPL, the display module DM, the protection layer PL, and the adhesive layers AL1, AL2, AL3, AL4, and AL5 may have flexible characteristics. Each of the window protection layer WPL, the window member WL, the refection prevention layer RPL, the display module DM, the protection layer PL, and the adhesive layers AL1, AL2, AL3, AL4, and AL5 may have a folding area FA.

The window protection layer WPL may have optically transparent characteristics. The window protection layer WPL may constitute an outermost surface of the display device DD. In an alternative embodiment of the invention, the window protection layer WPL may be omitted.

The window member WL may be disposed below the window protection layer WPL. The window member WL may have optically transparent characteristics. The window protection layer WPL and the window member WL may be coupled to each other by the first adhesive layer AL1. In an embodiment of the invention, where the window protection layer WPL is omitted, the first adhesive layer AL1 may also be omitted.

The refection prevention layer RPL may be disposed below the window member WL. The refection prevention layer RPL and the window member WL may be coupled to each other by the second adhesive layer AL2. The refection prevention layer RPL may reduce reflectivity of external light incident from an outside of the display device DD. In an alternative embodiment of the invention, the refection prevention layer RPL may be omitted or embedded in the display module DM.

In an embodiment, the refection prevention layer RPL may include a phase retarder and a polarizer. The phase retarder may be a film type or a liquid crystal coating type and may include a λ/2 phase retarder and/or a λ/4 phase retarder. The polarizer may also be a film type and may include an elongated synthetic resin film. The phase retarder and the polarizer may further include protection films. The phase retarder and the polarizer themselves or the protection films may be defined as a base layer of the refection prevention layer RPL.

In an embodiment, the refection prevention layer RPL may include color filters. The color filters have a predetermined arrangement. In an embodiment, the arrangement of the color filters may be determined based on light emission colors of pixels included in the display module DM. The refection prevention layer RPL may further include a black matrix adjacent to the color filters.

In an embodiment, the refection prevention layer RPL may include a destructive interference structure. In one embodiment, for example, the destructive interference structure may include a first refection layer and a second refection layer disposed in different layers from each other. First refection light and second refection light reflected respectively from the first refection layer and the second refection layer may be destructively interfered, and accordingly, the reflectivity of external light is reduced.

In an embodiment, the display module DM may be disposed below the refection prevention layer RPL. The display module DM and the refection prevention layer RPL may be coupled to each other by the third adhesive layer AL3. In an alternative embodiment of the invention, the third adhesive layer AL3 may be omitted, and the refection prevention layer RPL may be disposed directly on the display module DM. The display module DM may include a display panel and an input sensing layer that senses a touch TC (see FIG. 1A) thereon or thereabove from the outside.

The protection layer PL may be disposed below the display module DM. The protection layer PL and the display module DM may be coupled to each other by the fourth adhesive layer AL4. The protection layer PL may be a layer that protects the bottom surface of a bottom surface of the display module DM. The protection layer PL may be a polymer film. In one embodiment, for example, the protection layer PL may be a polyimide film or a polyethylene terephthalate film. In an embodiment, the protection layer PL may be a cushion layer. In such an embodiment, the protection layer PL may include a sponge, a foam, a urethane resin, or the like.

The fifth adhesive layer AL5 may be attached below the protection layer PL. The first to fifth adhesive layers AL1, AL2, AL3, AL4, and AL5 as described above may include a conventional bonding agent or adhesive agent.

The first cover plate CL1 and the second cover plate CL2 may be disposed below the fifth adhesive layer AL5, the first cover plate CL1 may be disposed in a first non-folding area NFA1 and the second cover plate CL2 may be disposed in a second non-folding area NAF2.

The first cover plate CL1 and the second cover plate CL2 may be metal plates or plastic plates. In one embodiment, for example, the first cover plate CL1 and the second cover plate CL2 may include stainless steel, aluminum, or an alloy thereof. The strength of the first cover plate CL1 and the second cover plate CL2 may be greater than the strength of the display module DM.

In an alternative embodiment of the invention, each of the first cover plate CL1 and the second cover plate CL2 may extend toward the folding area FA. In such an embodiment, a portion of the fifth adhesive layer AL5 in the folding area FA may be omitted, and the first cover plate CL1 and the second cover plate CL2 may not be attached by the fifth adhesive layer AL5 in the folding area FA.

Figure 4:
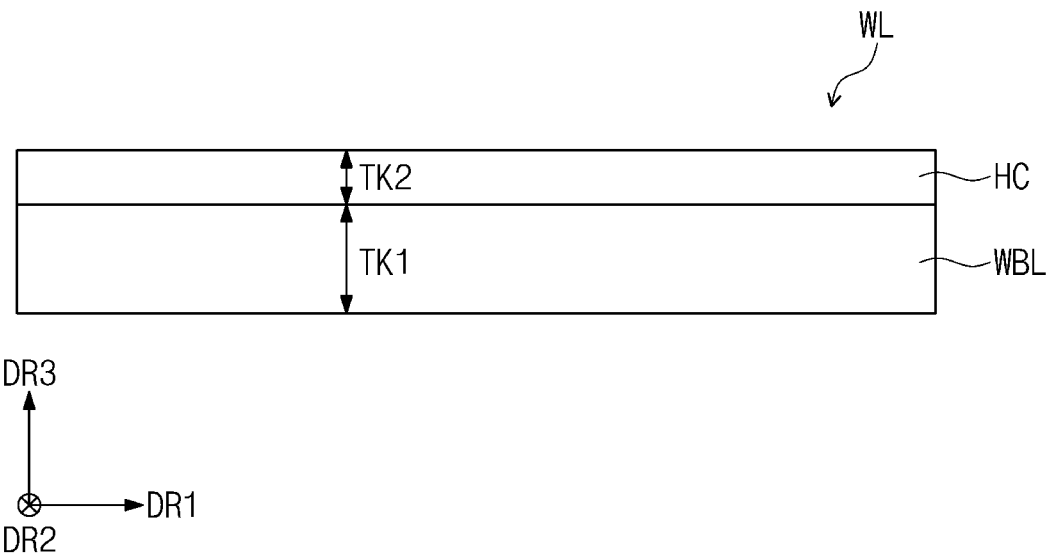
FIG. 4 is an enlarged cross-sectional view of a window member according to an embodiment of the invention.

FIG. 4 is an enlarged cross-sectional view of a window member according to an embodiment of the invention.

Referring to FIG. 4, an embodiment of a window member WL may include a base layer WBL and a hard coating layer HC. The hard coating layer HC may be disposed on the base layer WBL.

The base layer WBL may include or be formed of a polymer material. In one embodiment, for example, the base layer WBL may include or be made of at least one material selected from polyamide, polyimide, polyacrylate, polymethylmethacrylate ("PMMA"), polycarbonate ("PC"), polyethylenenaphthalate ("PEN"), polyvinylidene chloride, polyvinylidene difluoride ("PVDF"), polystyrene, ethylene vinylalcohol copolymer, and a combination thereof. However, a material of the base layer WBL is not limited to the polymer material described above, and any material having optically transparent characteristics and capable of providing a user with the image IM (see FIG. 1A) provided from the display panel DP (see FIG. 1A) of the display device DD (see FIG. 1A) may be used without limitations.

The base layer WBL may have a first thickness TK1 in a range of about 30 micrometers (μm) to about 100 μm. The base layer WBL may not effectively function as a support layer for supporting the hard coating layer HC when the first thickness TK1 is less than about 30 μm, while the total thickness of the display device DD may become substantially greater than a predetermined thickness for effective folding when the thickness of the base layer WBL is greater than about 100 μm. Particularly, as the first thickness TK1 of the base layer WBL increases, folding characteristics may be deteriorated.

The hard coating layer HC may be a layer including or formed of a composition for hard coating which includes at least one material selected from an organic-based composition, an inorganic-based composition and an organic/inorganic composite composition. In one embodiment, for example, the hard coating layer HC may include or be formed of a composition for hard coating which includes at least one selected from an acrylate-based compound, a siloxane compound, and a silsesquioxane compound. In an embodiment, the hard coating layer HC may further include inorganic particles. The hardness of the hard coating layer HC may be improved due to the inorganic particles. The inorganic particles may include at least one material selected from $SiO_2$, $TiO_2$, $Al_2O_3$, $ZrO_2$, ZnO, AlN, or $Si_3N_4$. In an embodiment, the inorganic particles may be surface-treated with an organic material such as silane to increase dispersion in the composition for hard coating.

The hard coating layer HC may have a second thickness TK2 of about 1 μm to about 50 μm. When the second thickness TK2 of the hard coating layer HC is less than about 1 μm, the window member WL may not have surface hardness sufficient to protect the display module DM. When the second thickness TK2 is greater than about 50 μm, the hard coating layer HC may not be suitable for realizing the thin display device DD (see FIG. 1A) because the thickness of the window member WL increases.

The window member WL, the base layer WBL, or the hard coating layer HC may satisfy predetermined characteristics of physical properties under a predetermined condition.

According to an embodiment of the invention, various physical property tests for the window member WL, the base layer WBL, or the hard coating layer HC are performed under a high temperature/high humidity condition as well as a room temperature condition. The window member WL satisfying at least one or more physical property conditions determined by performing various physical property evaluation over various temperature ranges may be applied to the display device DD (see FIG. 3A). Thus, a defect rate of the display device DD including the window member WL may be decreased, and as a result, product reliability of the display device DD may be improved. Detailed descriptions thereof will be described later in greater detail.

Figure 5:
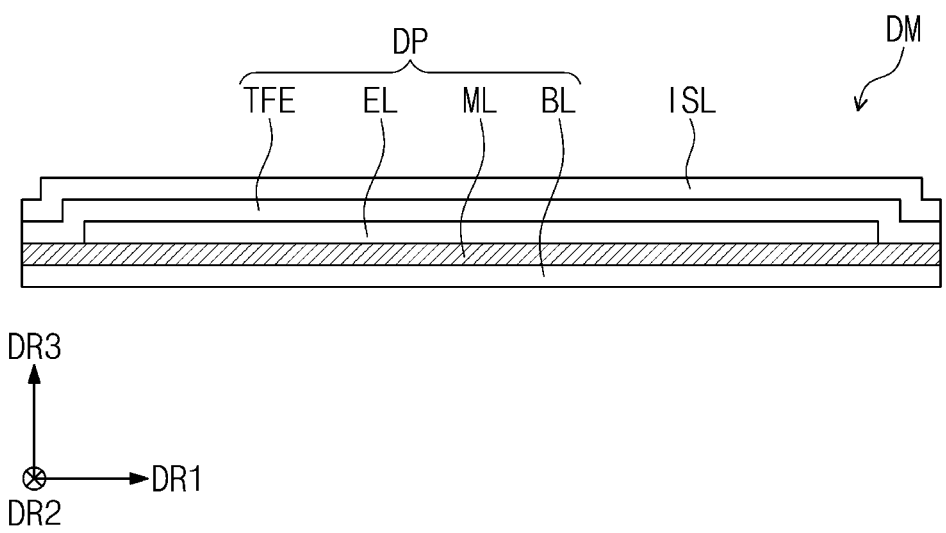
FIG. 5 is a schematic cross-sectional view of a display module according to an embodiment of the invention.

FIG. 5 is a schematic cross-sectional view of a display module according to an embodiment of the invention.

Referring to FIG. 5, a display module DM may include a display panel DP and an input sensing layer ISL.

An embodiment of the display panel DP may be a light emitting-type display panel, but is not particularly limited thereto. In one embodiment, for example, the display panel DP may be an organic light emitting display panel or a quantum-dot light emitting display panel. A light emitting layer of the organic light emitting display panel may include an organic light emitting material. A light emitting layer of the quantum-dot light emitting display panel may include quantum dot, quantum rods, or the like. Hereinafter, for convenience of description, an embodiment where the display panel DP is the organic light emitting display panel will be described in detail.

In an embodiment, as shown in FIG. 5, the display panel DP may include a base layer BL, a circuit layer ML, a light emitting element layer EL, and a thin film encapsulation layer TFE.

The base layer BL may include a flexible material, and the base layer BL may be, for example, a plastic substrate. The plastic substrate may include at least one material selected from an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin. In one embodiment, for example, the base layer BL may include a single layered polyimide-based resin. However, embodiments of the invention are not limited thereto, and the base layer BL may have a laminated structure including a plurality of insulating layers.

The circuit layer ML may be disposed on the base layer BL. The circuit layer ML may include a plurality of insulating layers, a plurality of conductive layers, and a semiconductor layer.

The light emitting element layer EL may be disposed on the circuit layer ML. The light emitting element layer EL may include a display element, for example, a plurality of organic light emitting diodes.

The thin film encapsulation layer TFE seals the light emitting element layer EL. The thin film encapsulation layer TFE may include a plurality of inorganic layers and an organic layer disposed therebetween.

The input sensing layer ISL may be disposed directly on the thin film encapsulation layer TFE. In the descriptions, "a component of A is disposed directly on a component of B means that there is not a separate bonding layer and a separate bonding member between the component of A and the component of B. The component of A is formed, and then the component of B is formed, through a consecutive process, on a base surface provided by the component of A. That is, the input sensing layer ISL may be formed on the thin film encapsulation layer TFE through a consecutive process. However, embodiments of the invention are not limited thereto, and the input sensing layer ISL is formed through a separate process, and then may be coupled to the display panel DP by an adhesive.

Figure 6:
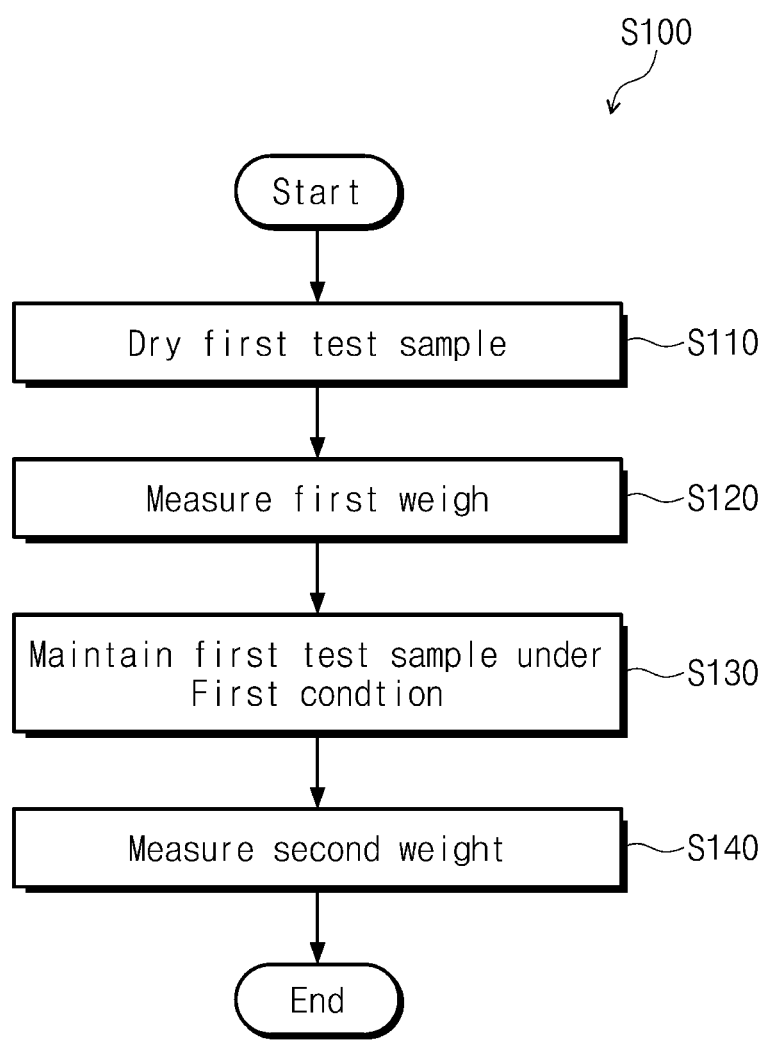
FIG. 6 is a flowchart for a first test process according to an embodiment of the invention.
Figure 7A:
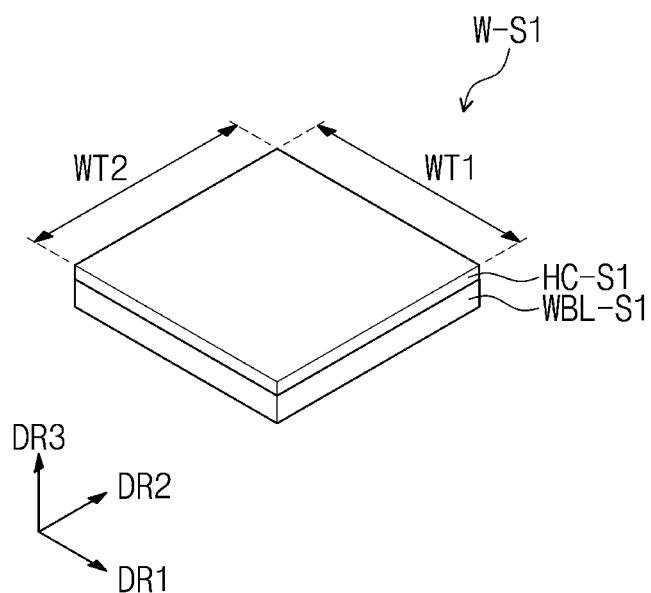
FIG. 7A is a perspective view of a first test sample according to an embodiment of the invention.

FIG. 6 is a flowchart for a first test process according to an embodiment of the invention. FIG. 7A is a perspective view of a first test sample according to an embodiment of the invention.

Referring to FIG. 4, FIG. 6, and FIG. 7A, a first test process (S100) may be a process for measuring a moisture absorption ratio of the window member WL. In an embodiment, a method for measuring moisture absorption weight may be used to measure a moisture absorption ratio.

A first test sample W-S1 having same physical properties as the window member WL is prepared. In one embodiment, for example, the first test sample W-S1 may be formed in a same manufacturing unit as the window member WL. Also, the first test sample W-S1 may be formed from the window member WL of the display device DD.

In the descriptions, a manufacturing unit may mean a product group made under a same condition and having uniform property and quality. The manufacturing unit may be referred to as a lot or a batch.

The first test sample W-S1 may be cut in a way such that each of a first width WT1 and a second width WT2 is about 1 centimeter (cm). The first test sample W-S1 may have a base layer WBL-S1 and a hard coating layer HC-S1.

In an embodiment, the first test sample W-S1 is dried (S110). The first test sample W-S1 is placed on a sample pan (not shown), and then moisture remaining in the first test sample W-S1 is removed at room temperature or higher. In one embodiment, for example, the first test sample W-S1 may be dried for about 1 hour at temperature of about 60° C. to about 85° C. and humidity of about 0%.

In an embodiment, first weight of the dried first test sample W-S1 is measured (S120). The first weight may be weight of the first test sample W-S1 in which the moisture is removed.

The first test sample W-S1 may be maintained for a predetermined duration under a first condition (S130). The first test sample W-S1 in a dried state may absorb moisture under the first condition. The first condition may including a first temperature in a high temperature range and a first humidity in a high humidity range. The first temperature may be in a range of about 60° C. to about 85° Q and the first humidity may be in a range of about 70% to about 98%. After maintained for a predetermined duration under the first condition, second weight of the first test sample W-S1 is measured (S140).

The first weight may represent the weight of the first test sample W-S1 before subjected to the first condition, and the second weight may represent the weight of the first test sample W-S1 after maintained for a predetermined duration under the first condition.

Table 1 below shows experiment data for verifying whether or not a crack occurs based on the moisture absorption ratio. The moisture absorption ratios described in Table 1 are measured after maintained for about 2 hours under a first condition at a first temperature of about 60° C. and a first humidity of about 93%.

The moisture absorption ratio may be a value of a ratio of a difference between the first weight and the second weight to the first weight in percentage. The moisture absorption ratio may be defined as (second weight-first weight)/first weight*100, for example.

TABLE 1

| Classification | Moisture absorption ratio (%) | | | | | |
| --- | --- | --- | --- | --- | --- | --- |
| | Embodiment 1 | Embodiment 2 | Embodiment 3 | Embodiment 4 | Embodiment 5 | Comparison Example |
| Window member | 1.74 | 1.94 | 2.00 | 1.95 | 1.75 | 2.41 |
| Crack | Not occur | Not occur | Not occur | Not occur | Not occur | Occur |

Embodiments 1 to 5 and Comparative Example may be test samples having same physical properties as window members that are manufactured in different manufacturing units. According to an embodiment of the invention, a moisture absorption ratio is measured from each of the test samples in the manufacturing units, and the window member WL formed in a same manufacturing unit as the test sample, the moisture absorption ratio of which satisfies a predetermined condition may be applied to a product. According to an embodiment of the invention, if the moisture absorption ratio is about 2.2% or less, a crack may not occur in the window member WL when a folding test is performed. Thus, the window member WL formed in a same manufacturing unit as the test sample in which the moisture absorption ratio is measured to be in a range of about 0% to about 2.2% may be applied to the display device DD (see FIG. 1A). Thus, the product reliability and durability of the display device DD (see FIG. 1A) may be improved.

The folding test may be a test in which folding operations are repeated 200,000 times with a radius of curvature of about 0.5 millimeter (mm). The folding test may be performed both at a room temperature of about 25° C. and under the first condition (the first temperature of about 60° C. and the first humidity of about 93%).

When moisture is absorbed in a polymer material, the polymer material may expand. A moisture absorption expansion coefficient of each of layers may not be equal to each other. In an embodiment of the window member WL, the moisture absorption expansion coefficient of the base layer WBL and the moisture absorption expansion coefficient of the hard coating layer HC may be different from each other. This may cause a crack of the window member WL, for example, crazing. When the moisture absorption ratio exceeds about 2.2%, a possibility that a crack of the window member WL occurs may increase. According to an embodiment of the invention, the window member WL having the moisture absorption ratio less than about 2.2% may be applied to the display device DD. Thus, a crack phenomenon of the window member WL due to a difference between moisture absorption expansion coefficients may be reduced.

Figure 7B:
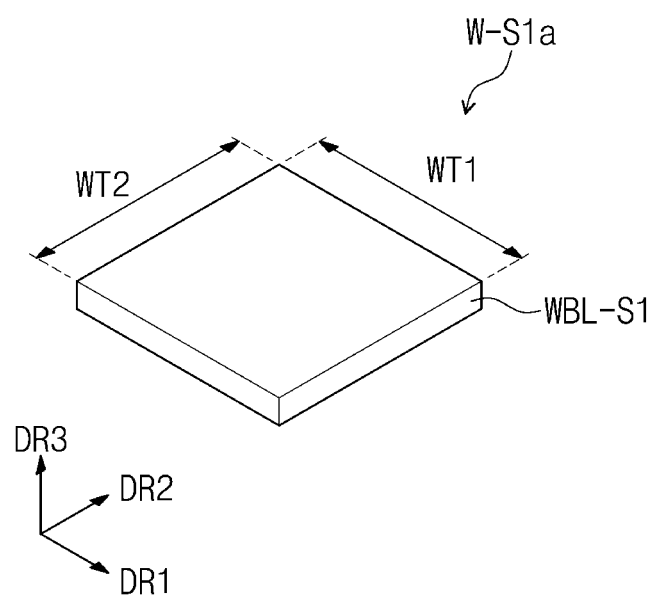
FIG. 7B is a perspective view of a first test sample according to an embodiment of the invention.

FIG. 7B is a perspective view of a first test sample according to an embodiment of the invention.

Referring to FIG. 4, FIG. 6, and FIG. 7B, a first test sample W-S1a may not include the hard coating layer HC-S1 (see FIG. 7A), unlike the first test sample W-S1 (see FIG. 7A) described above. The first test sample W-S1a may include only a base layer WBL-S1.

Through the first test process (S100) described with reference to FIG. 6, a moisture absorption ratio of the first test sample W-S1a may be measured. Table 2 below shows experiment data for verifying whether or not a crack occurs based on a moisture absorption ratio.

TABLE 2

| Classification | Moisture absorption ratio (%) | | | | | |
| --- | --- | --- | --- | --- | --- | --- |
| | Embodiment 1 | Embodiment 2 | Embodiment 3 | Embodiment 4 | Embodiment 5 | Comparison Example |
| Base layer | 1.70 | 1.77 | 1.81 | 1.80 | 1.68 | 1.90 |
| Crack | Not occur | Not occur | Not occur | Not occur | Not occur | Occur |

Table 3 below show data that derives a moisture absorption ratio of the hard coating layer. The moisture absorption ratio of the hard coating layer may be obtained through a difference between the moisture absorption ratio of the first test sample W-S1 (see FIG. 7A) and the moisture absorption ratio of the first test sample W-S1a.

TABLE 3

| Classification | Moisture absorption ratio (%) | | | | | |
| --- | --- | --- | --- | --- | --- | --- |
| | Embodiment 1 | Embodiment 2 | Embodiment 3 | Embodiment 4 | Embodiment 5 | Comparison Example |
| Hard coating layer | 0.041 | 0.168 | 0.189 | 0.144 | 0.067 | 0.507 |
| Crack | Not occur | Not occur | Not occur | Not occur | Not occur | Occur |

Referring to Table 3, the moisture absorption ratio of Comparative Example in which a crack occurs may be may be about 2.68 times or greater than the moisture absorption ratio of Embodiment 3 in which a crack does not occur. In an embodiment of the invention, the window member WL formed in a same manufacturing unit as the test sample in which the moisture absorption ratio of the hard coating layer HC is measured to be in a range of about 0% to about 2.0% may be applied to the display device DD (see FIG. 1A). Thus, the product reliability and durability of the display device DD (see FIG. 1A) may be improved.

Figure 8:
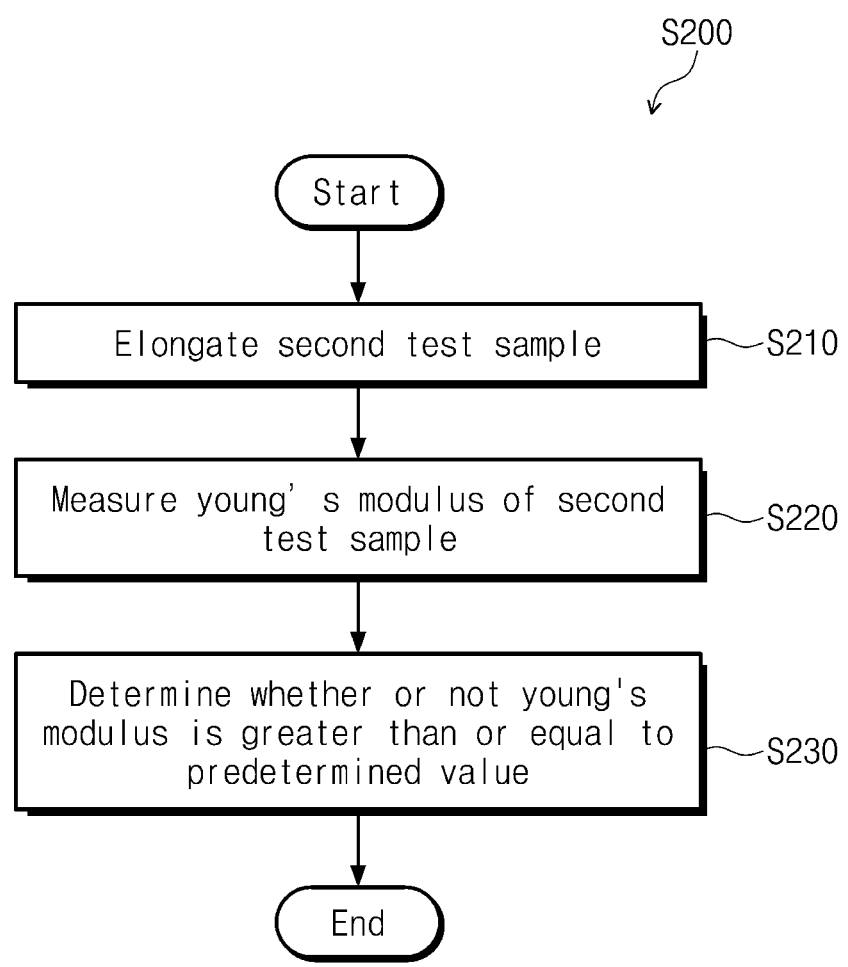
FIG. 8 is a flowchart for a second test process according to an embodiment of the invention.
Figure 9A:
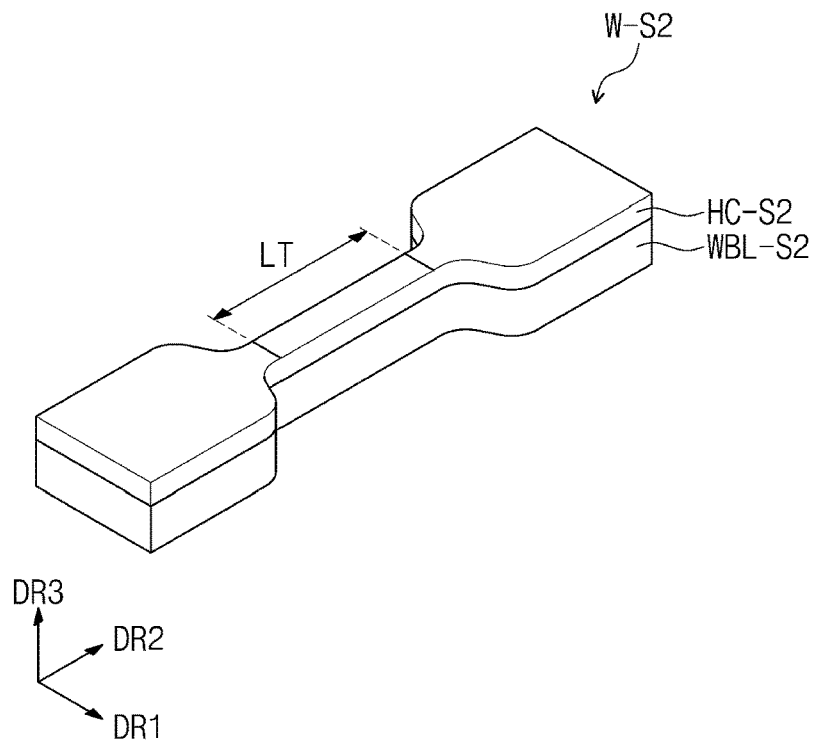
FIG. 9A is a perspective view of a second test sample according to an embodiment of the invention.
Figure 9B:
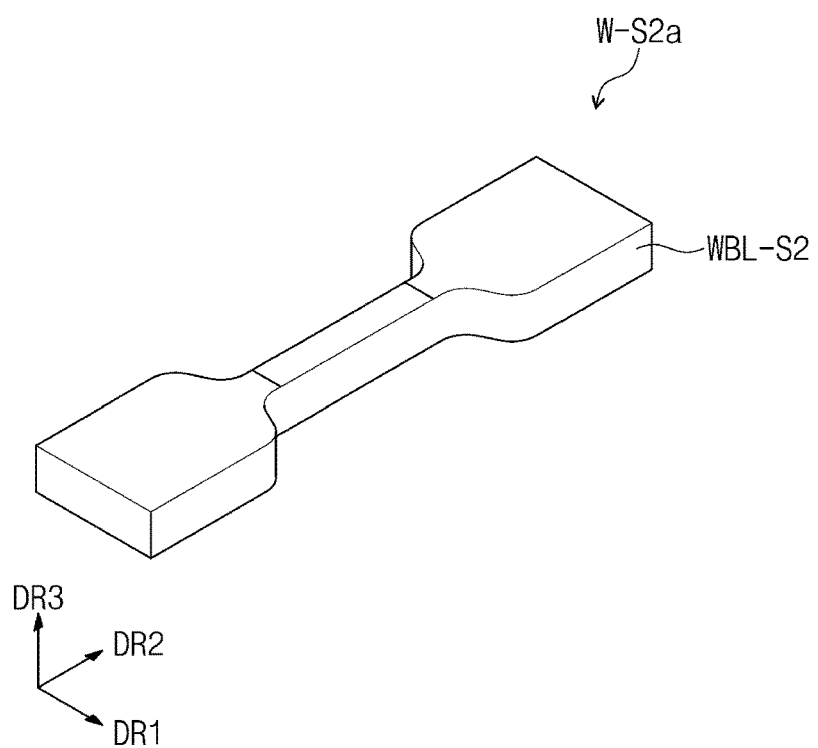
FIG. 9B is a perspective view of a second test sample according to an embodiment of the invention.

FIG. 8 is a flowchart for a second test process according to an embodiment of the invention. FIG. 9A is a perspective view of a second test sample according to an embodiment of the invention. FIG. 9B is a perspective view of a second test sample according to an embodiment of the invention.

Referring to FIG. 4, FIG. 8, FIG. 9A, and FIG. 9B, a second test process (S200) may be a process for measuring a Young's modulus and a yield point. In such an embodiment, a universal testing machine may be used to measure the Young's modulus and the yield point. The universal testing machine may be a testing machine that can perform a tension test, a compression test, a bending test, a shear test, or the like. In an embodiment of the invention, a fatigue testing machine, instead of the universal testing machine, may be used to measure the Young's modulus and the yield point.

A second test sample W-S2 having same physical properties as the window member WL is prepared. In one embodiment, for example, the second test sample W-S2 may be formed in a same manufacturing unit as the window member WL. Also, the second test sample W-S2 may be formed from the window member WL of the display device DD (see FIG. 1A).

The second test sample W-S2 may be cut on the basis of a standard of ISO 527-3 type 5. A gauge length LT of the second test sample W-S2 may be about 65 mm. The second test sample W-S2 may include a base layer WBL-S2 and a hard coating layer HC-S2.

The second test process (S200) may be performed under the same condition as the first condition of the first test process (S100, see FIG. 6). In one embodiment, for example, the first condition may include a first temperature in a high temperature range and a first humidity in a high humidity range. The first temperature may be in a range of about 60° C. to about 85° Q and the first humidity may be about 70% to about 98%. In one embodiment, for example, the second test process (S200) may be performed under the first condition at a first temperature of about 60° C. and a first humidity of about 93%.

The second test sample W-S2 is mounted on an analysis instrument. The second test sample W-S2 mounted on the analysis instrument may be elongated (S210). A tensile rate of a tensile test may be about 5 millimeters per minute (mm/min).

A Young's modulus of the second test sample W-S2 is measured (S220). The Young's modulus may be measured in a tensile strain section of about 0.05% to about 0.5% of the second test sample W-S2.

It is determined whether or not the measured Young's modulus is greater than or equal to a predetermined value (S230). If the Young's modulus is less than or equal to the predetermined value, a crack may occur in the window member WL (see FIG. 4) when repeatedly folded about 200,000 times with a radius of curvature of about 0.5 mm.

Table 4 below shows experiment data for verifying whether or not a crack occurs based on the Young's modulus.

TABLE 4

| Classification | Young's modulus (GPa) | | | | | |
| --- | --- | --- | --- | --- | --- | --- |
| | Embodiment 1 | Embodiment 2 | Embodiment 3 | Embodiment 4 | Embodiment 5 | Comparison Example 1 |
| Window member | 5.22 | 5.35 | 5.25 | 5.16 | 5.26 | 4.96 |
| Crack | Not occur | Not occur | Not occur | Not occur | Not occur | Occur |

Referring to Table 4, it may be confirmed that a crack may occur when the Young's modulus is about 4.96 gigapascals (GPa). Thus, a condition of the Young's modulus applicable to a product may be set to be in a range of about 5 GPa to about 8 GPa. When the Young's modulus of the second test sample W-S2 is about 5 GPa or greater in the second test process (S200), it may be determined to be applicable to a product. Table 5 below shows experiment data for verifying whether or not a crack occurs based on a yield point of the second test sample W-S2a. The second test sample W-S2a may include only a base layer WBL-S2.

TABLE 5

| Classification | Yield point (%) | | | | | |
| --- | --- | --- | --- | --- | --- | --- |
| | Embodiment 1 | Embodiment 2 | Embodiment 3 | Embodiment 4 | Embodiment 5 | Comparison Example 1 |
| Base layer | 1.10 | 1.09 | 1.10 | 1.09 | 1.10 | 1.08 |
| Crack | Not occur | Not occur | Not occur | Not occur | Not occur | Occur |

Referring to Table 5, the yield point may be a point that has a maximum tensile strength in a stress-strain curve. Table 5 shows tensile strain at a point at which the yield point is present. Referring to Table 5, if the yield point is present in a section in which the tensile strain is less than about 1.09%, a crack may occur in the window member WL (see FIG. 4) when repeatedly folded about 200,000 times with a radius of curvature of about 0.5 mm. Thus, a condition of the yield point applicable to a product may be set to be about 1.09% or greater. Also, a condition that the Young's modulus of the base layer WBL is about 7 GPa or greater at a room temperature and the Young's modulus of the window member WL is about 6 GPa or greater at a room temperature may be additionally considered as a condition for determining whether or not the window member WL is applicable to the display device DD (see FIG. 1A). Also, for the yield point of each of the base layer WBL and the window member WL at a room temperature, it may be additionally considered that the yield point is present in a section in which the tensile strain is about 1% or greater.

TP may be a Berkovich diamond indenter. According to an embodiment of the invention, a maximum load may be about 5 mN, a loading/unloading rate may be about 50 millinewton per minute (mN/min), the number of measurement points may be about 12, and a maximum load holding time may be about 120 seconds.

It is determined whether or not the measured hardness is greater than or equal to a predetermined value (S320). If the hardness is less than or equal to the predetermined value, a crack may occur in the window member WL (see FIG. 4) when repeatedly folded about 200,000 times with a radius of curvature of about 0.5 mm.

Table 6 below shows experiment data for verifying whether or not a crack occurs based on the hardness of the hard coating layer HC-S3. The hardness of each of embodiments may be an average value with respect to hardness measured at 12 measurement points. However, this is merely exemplary, and alternatively, the number of the measurement points may be 12 or greater, or 12 or less.

TABLE 6

| | Hardness (GPa) | | | | | |
| --- | --- | --- | --- | --- | --- | --- |
| Classification | Embodiment 1 | Embodiment 2 | Embodiment 3 | Embodiment 4 | Embodiment 5 | Comparison Example 1 |
| Window member | 0.37 | 0.38 | 0.37 | 0.38 | 0.37 | 0.29 |
| Crack | Not occur | Not occur | Not occur | Not occur | Not occur | Occur |

Figure 10:
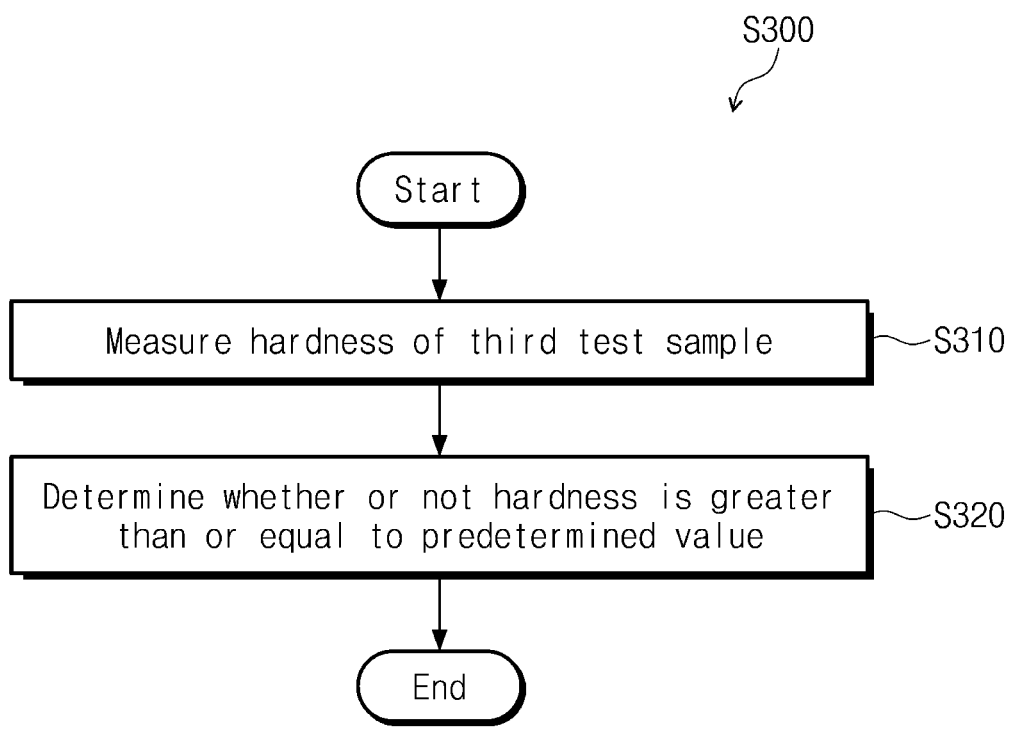
FIG. 10 is a flowchart for a third test process according to an embodiment of the invention.
Figure 11:
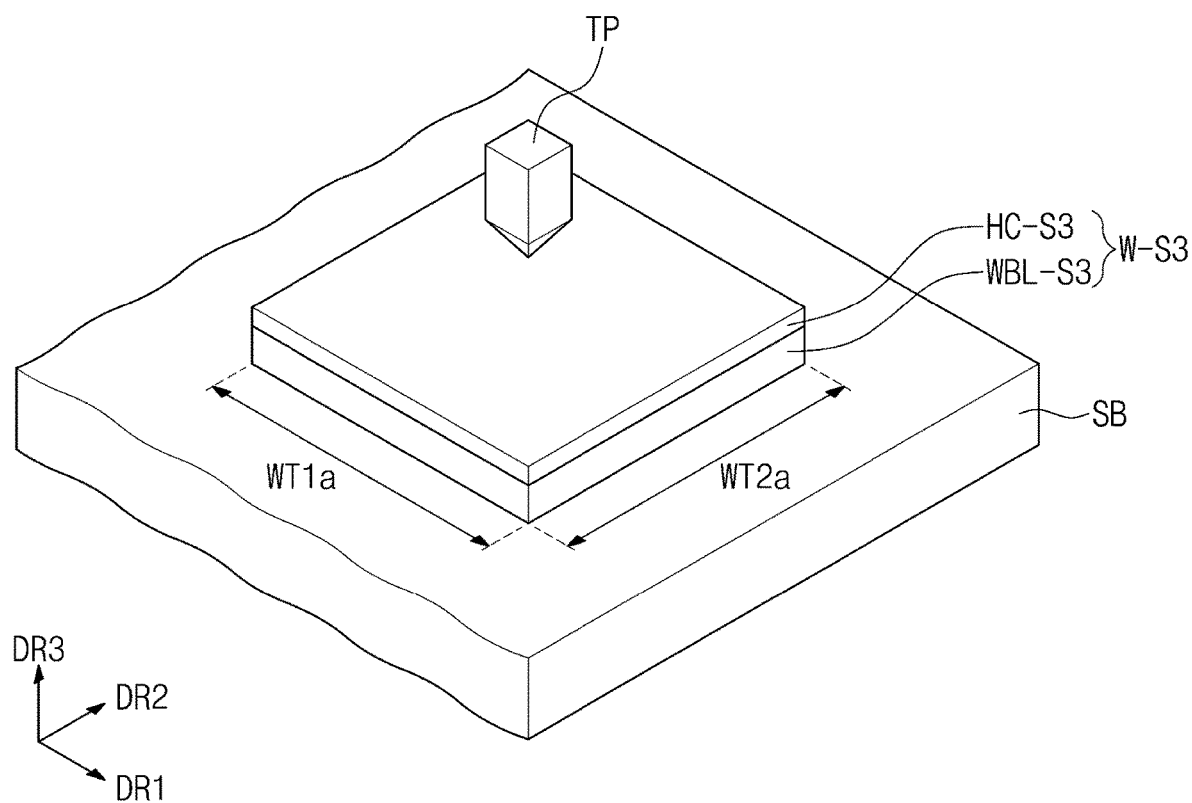
FIG. 11 is a perspective view illustrating the third test process.

FIG. 10 is a flowchart for a third test process according to an embodiment of the invention. FIG. 11 is a perspective view illustrating the third test process.

Referring to FIG. 4, FIG. 10, and FIG. 11, a third test process (S300) may be a process for measuring hardness. In an embodiment, a nano-indentation test method may be used to measure the hardness. In one embodiment, for example, the hardness may be measured by a Berkovich indenter hardness test. The hardness measurement may be performed at a room temperature, and the room temperature may be 25° C.

A third test sample W-S3 having same physical properties as the window member WL is prepared. In one embodiment, for example, the third test sample W-S3 may be formed in a same manufacturing unit as the window member WL. Also, the third test sample W-S3 may be formed from the window member WL of the display device DD (see FIG. 1A).

The third test sample W-S3 may be cut in a way such that each of a first width WT1a and a second width WT2a is about 2 cm. The third test sample W-S3 may have a base layer WBL-S3 and a hard coating layer HC-S3.

The surface of the third test sample W-S3 is pressed by an indenter TP with a force having a unit of millinewton (mN), and then the pressed area is calculated, to measure the hardness of the third test sample W-S3 (S310). The surface may be one face of the hard coating layer HC-S3.

The third test sample W-S3 may be disposed on a stage SB. The base layer WBL-S3 and the hard coating layer HC-S3 may be disposed on the stage SB in the order of the base layer WBL-S3 and the hard coating layer HC-S3. In one embodiment, for example, the base layer WBL-S3 may be disposed between the stage SB and the hard coating layer HC-S3.

The hardness of the third test sample W-S3 may be measured by a method based on ISO 14577-1. The indenter Referring to Table 6, if the hardness is less than about 0.3 GPa, a crack may occur in the window member WL (see FIG. 4) when repeatedly folded about 200,000 times with a radius of curvature of about 0.5 mm. Thus, the hardness applicable to a product may be set to be in a range of about 0.3 GPa to about 50 GPa.

According to an embodiment of the invention, the window member WL may be applied to the display device DD (see FIG. 1A) when the physical properties thereof satisfy only the condition of the moisture absorption ratio measured in the first test process (S100, see FIG. 6). According to an alternative embodiment of the invention, the window member WL may be applied to the display device DD (see FIG. 1A) when the physical properties thereof satisfy the condition of the moisture absorption ratio measured in the first test process (S100, see FIG. 6) and the condition of the Young's modulus and/or the yield point measured in the second test process (S200, see FIG. 8). According to another alternative embodiment of the invention, the window member WL may be applied to the display device DD (see FIG. 1A) when the physical properties thereof satisfy all of the condition of the moisture absorption ratio measured in the first test process (S100, see FIG. 6), the condition of the Young's modulus and/or the yield point measured in the second test process (S200, see FIG. 8), and the condition of the hardness measured in the third test process (S300).

In an embodiment of the invention, analysis of thermogravimetric-mass and a coefficient of thermal expansion among the physical properties of the window member WL may be additionally performed.

A test sample for analyzing thermogravimetric-mass may be cut in a way such that each of width and length is about 1 cm as illustrated in FIG. 7A and FIG. 7B. The weight of the test sample is checked after increasing temperature by about 10° C. per min from a room temperature to about 1000° C., and a residue, for example, a weight ratio of silica, may be identified.

Table 7 below shows experiment data for verifying whether or not a crack occurs based on the weight ratio of silica.

TABLE 7

| | Residue (silica contents) (%) | | | | | |
|---|---|---|---|---|---|---|
| Classification | Embodiment 1 | Embodiment 2 | Embodiment 3 | Embodiment 4 | Embodiment 5 | Comparative Example 1 |
| Base layer | 32.85 | 32.80 | 32.68 | 32.45 | 32.99 | 32.94 |
| Window member | 26.90 | 26.65 | 27.17 | 28.89 | 27.09 | 26.84 |
| Crack | Not occur | Not occur | Not occur | Not occur | Not occur | Occur |

In an embodiment, a thermomechanical analyzer may be used to analyze a coefficient of thermal expansion. A test sample for analyzing the coefficient of thermal expansion may be cut into about 4 mm×about 4 mm in width and length, respectively. The test sample may be mounted on an analysis instrument in a way such that some sections thereof are exposed to heat. In one embodiment, for example, the length of some sections may be about 16 mm. The temperature is lowered to be about −50° C. firstly, and then heating is slowly performed to about 150° C. at a rate of about 5° C. per min Subsequently, the temperature is lowered to about −50° C. secondly, and then raised to about 150° C. again The coefficient of thermal expansion in a section of about −40° C. to about 85° C. may be checked in a linear section in which the temperature is raised firstly and secondly. For example, it may be understood that the test sample expands by about 24.6 μm per meter for every about 1° C. increase when the coefficient of thermal expansion is about 24.6 parts per million per degree Celsius (ppm/° C.).

Table 8 below shows experiment data for verifying whether or not a crack occurs based on the coefficient of thermal expansion.

TABLE 8

| | | Coefficient of thermal expansion (ppm/° C.) | | | | | |
|---|---|---|---|---|---|---|---|
| Classification | Times | Embodiment 1 | Embodiment 2 | Embodiment 3 | Embodiment 4 | Embodiment 5 | Comparative Example 1 |
| Base layer | First | 17.4 | 18.8 | 16.7 | 18.6 | 18.1 | 16.9 |
| | Second | 19.5 | 19.5 | 19.1 | 18.7 | 18.5 | 17.8 |
| Window member | First | 24.6 | 22.6 | 21.2 | 23.5 | 23.5 | 19.3 |
| | Second | 23.7 | 24.2 | 25.1 | 24.2 | 23.3 | 23.3 |
| Crack | | Not occur | Not occur | Not occur | Not occur | Not occur | Occur |

According to an embodiment of the invention, various physical property tests are performed under the high temperature/high humidity condition as well as a room temperature condition. The window member satisfying at least one or more physical property conditions may be applied to the display device by performing various physical property evaluation over various temperature ranges. Thus, a defect rate of the display device including the window member may be decreased, and as a result, product reliability of the display device may be improved.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
a display module; and
a window member disposed on the display module, wherein the window member comprises a base layer and a hard coating layer disposed on the base layer,
wherein a moisture absorption ratio of the window member is about 2.2% or less under a first condition including a first temperature and a first humidity,
wherein the first temperature is in a range of about 60° C. to about 85° C., and the first humidity is in a range of about 70% to about 98%, and
wherein the moisture absorption ratio is a numerical value measured after maintained for about 2 hours under the first condition.

2. The display device of claim 1, wherein the first temperature is about 60° C., and the first humidity is about 93%.

3. The display device of claim 1, wherein
the moisture absorption ratio is a value in percentage corresponding to a ratio of a difference between a first weight and a second weight to the first weight of the window member,
wherein the first weight represents a weight of the window member before subjected to the first condition, and
the second weight represents a weight of the window member after maintained for about 2 hours under the first condition.

4. The display device of claim 3, wherein the first weight represents a weight of the window member after dried under a second condition different from the first condition.

5. The display device of claim 4, wherein
the second condition includes a second temperature and a second humidity,
wherein the second temperature is in a range of about 60° C. to about 85° C., and the second humidity is about 0%.

6. The display device of claim 1, wherein a Young's modulus of the window member measured under the first condition is in a range of about 5 GPa to about 8 GPa.

7. The display device of claim 6, wherein a test rate of a tensile test for measuring the Young's modulus is about 5 mm/min.

8. The display device of claim 6, wherein the Young's modulus is measured in a section in which tensile strain of the window member is in a range of about 0.05% to about 0.5%.

9. The display device of claim 1, wherein a yield point of the base layer under the first condition is present in a section in which tensile strain of the base layer is not less than about 1.09%.

10. The display device of claim 1, wherein hardness of the window member is in a range of about 0.3 GPa to about 50 GPa.

11. The display device of claim 10, wherein the hardness is measured on a surface of the hard coating layer by a Berkovich indenter hardness test.

12. The display device of claim 1, wherein each of the display module and the window member include a folding area.

13. A method for manufacturing a display device, the method comprising:
preparing a window member comprising a base layer and a hard coating layer disposed on the base layer;
preparing a first test sample having same physical properties as the window member;
performing a first test of measuring a moisture absorption ratio of the first test sample under a first condition including a first temperature and a first humidity;
preparing a second test sample having the same physical properties as the window member;
performing a second test of measuring a Young's modulus of the second test sample under the first condition;
preparing a third test sample having the same physical properties as the window member;
performing a third test of measuring a hardness of the third test sample under a second condition different from the first condition; and
coupling the window member to a display module when a predetermined condition is satisfied in at least one test selected from the first to third tests.

14. The method of claim 13, wherein the performing the first test comprises:
drying the first test sample;
measuring a first weight of the dried first test sample;
maintaining the first test sample for about 2 hours under the first condition;
measuring a second weight of the first test sample; and
determining whether or not a value in percentage corresponding to a ratio of a difference between the first weight and the second weight to the first weight is about 2.2% or less.

15. The method of claim 13, wherein the performing the second test comprises:
elongating the second test sample;
measuring the Young's modulus of the second test sample; and
determining whether or not the Young's modulus is in a range of about 5 GPa to about 8 GPa,
wherein a tensile rate of a tensile test to elongate the second test sample is about 5 mm/min, and
the Young's modulus is measured in a section in which tensile strain is in a range of about 0.05% to about 0.5%.

16. The method of claim 13, wherein the performing the third test comprises:
disposing the third test sample on a stage;
measuring the hardness of the third test sample using a Berkovich diamond indenter; and
determining whether or not the hardness is in a range of about 0.3 GPa to about 50 GPa.

17. A window member for a display device, the window member comprising:
a base layer; and
a hard coating layer disposed on the base layer,
wherein a moisture absorption ratio of an entirety of the base layer and the hard coating layer is about 2.2% or less under a first condition including a first temperature and a first humidity,
wherein the first temperature is about 60° C., and the first humidity is about 93%, and
wherein the moisture absorption ratio is a numerical value measured after maintained for about 2 hours under the first condition.

18. The window member of claim 17, wherein
the moisture absorption ratio is a value in percentage corresponding to a ratio of a difference between a first weight and a second weight to the first weight of the base layer and the hard coating layer,
wherein the first weight represents a weight of the entirety of the base layer and the hard coating layer before subjected to the first condition, and
the second weight represents a weight of the entirety of the base layer and the hard coating layer after maintained for about 2 hours under the first condition.

19. The window member of claim 17, wherein
a Young's modulus of the entirety of the base layer and the hard coating layer under the first condition is in a range of about 5 GPa to about 8 GPa,
a yield point of the base layer under the first condition is present in a section in which tensile strain of the base layer is not less than about 1.09%, and
a hardness measured on a surface of the hard coating layer by a Berkovich indenter hardness test is in a range of about 0.3 GPa to about 50 GPa.

\* \* \* \* \*